US012560747B2

(12) United States Patent　　　　(10) Patent No.: US 12,560,747 B2
Thiel et al.　　　　　　　　　　　(45) Date of Patent: *Feb. 24, 2026

(54) SOLAR CONTROL COATINGS AND METHODS OF FORMING SOLAR CONTROL COATINGS

(71) Applicant: Vitro Flat Glass LLC, Cheswick, PA (US)

(72) Inventors: James P. Thiel, Lihue, HI (US); Andrew V. Wagner, Pittsburgh, PA (US); Adam D. Polcyn, Pittsburgh, PA (US); Dennis J. O'Shaughnessy, Allison Park, PA (US); Paul A. Medwick, Wexford, PA (US); Harry Buhay, Yardley, PA (US); Jeffrey A. Benigni, Manorville, PA (US); Donald Anthony, Lower Burrell, PA (US)

(73) Assignee: Vitro Flat Glass LLC, Cheswick, PA (US)

( * ) Notice: Subject to any disclaimer, the term of this patent is extended or adjusted under 35 U.S.C. 154(b) by 107 days.

This patent is subject to a terminal disclaimer.

(21) Appl. No.: 17/146,606

(22) Filed: Jan. 12, 2021

(65) Prior Publication Data

US 2021/0141127 A1　　May 13, 2021

Related U.S. Application Data

(63) Continuation of application No. 16/232,446, filed on Dec. 26, 2018, now Pat. No. 10,921,495.

(60) Provisional application No. 62/611,644, filed on Dec. 29, 2017.

(51) Int. Cl.
| | |
|---|---|
| *B32B 15/04* | (2006.01) |
| *B32B 17/06* | (2006.01) |
| *C03C 17/36* | (2006.01) |
| *C23C 14/02* | (2006.01) |
| *C23C 14/08* | (2006.01) |
| *C23C 14/35* | (2006.01) |
| *C23C 14/54* | (2006.01) |
| *G02B 5/00* | (2006.01) |

(52) U.S. Cl.
CPC .............. *G02B 5/003* (2013.01); *C03C 17/36* (2013.01); *C03C 17/3613* (2013.01); *C03C 17/3626* (2013.01); *C03C 17/3639* (2013.01); *C03C 17/3647* (2013.01); *C03C 17/366* (2013.01); *C03C 17/3676* (2013.01); *C03C 17/3681* (2013.01); *C23C 14/024* (2013.01); *C23C 14/08* (2013.01); *C23C 14/35* (2013.01); *C23C 14/541* (2013.01)

(58) Field of Classification Search
CPC .................................................. C03C 17/366
USPC ................................................ 428/432, 434
See application file for complete search history.

(56) References Cited

U.S. PATENT DOCUMENTS

| | | | |
|---|---|---|---|
| 4,193,236 | A | 3/1980 | Mazzoni et al. |
| 4,464,874 | A | 8/1984 | Shea, Jr. et al. |
| 4,466,562 | A | 8/1984 | DeTorre |
| 4,671,155 | A | 6/1987 | Goldinger |
| 5,088,258 | A | 2/1992 | Schield et al. |
| 5,106,663 | A | 4/1992 | Box |
| 5,425,861 | A | 6/1995 | Hartig et al. |
| 5,521,765 | A | 5/1996 | Wolfe |
| 5,667,853 | A | 9/1997 | Fukuyoshi et al. |
| 6,045,896 | A | 4/2000 | Boire et al. |
| 6,218,018 | B1 | 4/2001 | McKown et al. |
| 6,391,462 | B1 | 5/2002 | Jang |
| 7,473,471 | B2 | 1/2009 | Finley et al. |
| 7,517,583 | B2 | 4/2009 | Onishi et al. |
| 7,659,002 | B2 | 2/2010 | Coster et al. |
| 7,901,781 | B2 | 3/2011 | Maschwitz et al. |
| 8,231,977 | B2 | 7/2012 | Roquiny et al. |
| 8,500,965 | B2 | 8/2013 | Thiel |
| 8,895,149 | B2 | 11/2014 | Imran et al. |
| 9,299,649 | B2 | 3/2016 | Chiu et al. |
| 10,345,499 | B2 | 7/2019 | Medwick et al. |
| 10,921,495 | B2 | 2/2021 | Thiel et al. |
| 11,402,557 | B2 | 8/2022 | Wagner et al. |
| 2002/0197459 | A1 | 12/2002 | Maurer et al. |
| 2005/0008852 | A1* | 1/2005 | Hartig ................ C03C 17/3626 428/336 |
| 2006/0083938 | A1 | 4/2006 | Kim et al. |
| 2007/0042200 | A1* | 2/2007 | Wityak .................... C22C 5/06 428/669 |
| 2007/0248791 | A1 | 10/2007 | Hartig |
| 2008/0174872 | A1 | 7/2008 | Morimoto et al. |
| 2008/0311389 | A1 | 12/2008 | Roquiny et al. |
| 2009/0015909 | A1 | 1/2009 | Fleury et al. |
| 2009/0274901 | A1 | 11/2009 | Roquiny |
| 2010/0046191 | A1 | 2/2010 | den Boer et al. |
| 2010/0279144 | A1 | 11/2010 | Frank et al. |

(Continued)

FOREIGN PATENT DOCUMENTS

| | | |
|---|---|---|
| CN | 102918433 A | 2/2013 |
| EP | 1641722 B1 | 9/2009 |

(Continued)

*Primary Examiner* — Lauren R Colgan

(74) *Attorney, Agent, or Firm* — The Webb Law Firm

(57) ABSTRACT

A coated article includes a substrate and a coating applied over at least a portion of the substrate. The coating includes at least one metallic layer formed from one or more silver compounds doped with at least one metal selected from Groups 3 to 15 of the periodic table of the elements. Also disclosed are capsules that can absorb electromagnetic energy as well as a process of forming an antimony-doped tin oxide coating layer.

19 Claims, No Drawings

(56)          References Cited

U.S. PATENT DOCUMENTS

| | | | |
|---|---|---|---|
| 2011/0117300 A1 | 5/2011 | Wagner | |
| 2011/0169402 A1 | 7/2011 | Lingle et al. | |
| 2011/0174362 A1 | 7/2011 | Tanner et al. | |
| 2011/0236715 A1* | 9/2011 | Polcyn | C03C 17/366 |
| | | | 428/623 |
| 2012/0219821 A1* | 8/2012 | Frank | C03C 17/3639 |
| | | | 428/630 |
| 2012/0225224 A1* | 9/2012 | Blacker | C03C 17/3639 |
| | | | 428/34 |
| 2012/0225304 A1 | 9/2012 | Imran et al. | |
| 2012/0225316 A1 | 9/2012 | Imran et al. | |
| 2013/0057951 A1 | 3/2013 | Hevesi et al. | |
| 2013/0059137 A1* | 3/2013 | Hevesi | C03C 17/3626 |
| | | | 428/213 |
| 2013/0117992 A1 | 5/2013 | Imran et al. | |
| 2013/0118674 A1 | 5/2013 | Imran et al. | |
| 2014/0154524 A1 | 6/2014 | Imran et al. | |
| 2014/0170434 A1* | 6/2014 | Hassan | G02B 1/10 |
| | | | 427/164 |
| 2014/0272453 A1 | 9/2014 | Polcyn et al. | |
| 2016/0201189 A1 | 7/2016 | Palacios-Laloy | |
| 2016/0223729 A1* | 8/2016 | Medwick | C03C 17/3639 |
| 2016/0297708 A1* | 10/2016 | Brossard | E06B 9/24 |
| 2017/0341977 A1 | 11/2017 | Polcyn et al. | |
| 2018/0118614 A1 | 5/2018 | Polcyn et al. | |
| 2018/0208503 A1 | 7/2018 | Hagen et al. | |
| 2018/0244569 A1* | 8/2018 | Lu | C03C 17/36 |
| 2018/0251886 A1 | 9/2018 | Lu et al. | |

FOREIGN PATENT DOCUMENTS

| | | | |
|---|---|---|---|
| EP | 2821522 A1 | 1/2015 | |
| JP | H2121836 A | 5/1990 | |
| JP | 200447216 A | 2/2004 | |
| JP | 2015219690 A | 12/2015 | |
| KR | 101067763 B1 | 9/2011 | |
| RU | 2439009 C2 | 6/2008 | |
| WO | 9011975 A1 | 10/1990 | |
| WO | 0120375 A1 | 3/2001 | |
| WO | 2011107277 A1 | 9/2011 | |
| WO | 2012118469 A1 | 9/2012 | |
| WO | 2013129624 A1 | 9/2013 | |
| WO | 2017006026 A1 | 1/2017 | |

* cited by examiner

SOLAR CONTROL COATINGS AND METHODS OF FORMING SOLAR CONTROL COATINGS

CROSS REFERENCE TO RELATED APPLICATIONS

This application is a continuation of the U.S. patent application Ser. No. 16/232,446, filed Dec. 26, 2018, which claims the benefit of U.S. Provisional Patent Application No. 62/611,644, filed Dec. 29, 2017, which are incorporated herein by reference in its entirety.

FIELD OF THE INVENTION

The present invention relates to solar control coatings and methods of forming such coatings.

BACKGROUND OF THE INVENTION

Substrates used in a variety of applications including architectural applications, automotive applications, consumer appliances, etc. are typically coated with a functional and/or aesthetic coating. For example, solar control coatings are commonly applied to transparent architectural and automotive substrates to reflect and/or absorb light. For example, solar control coatings are typically used to block or filter certain ranges of electromagnetic radiation to reduce the amount of solar energy entering a vehicle or building. This reduction of solar energy transmittance helps reduce the energy load on the cooling units of the vehicle or building.

Solar control coatings can be applied to various substrates such as glass substrates using various techniques including chemical vapor deposition ("CVD"), spray pyrolysis, and magnetron sputtered vacuum deposition ("MSVD"). MSVD processes are especially suited for complex coatings containing one or more coating layers because they allow for a wider selection of coating materials to be deposited at thinner thicknesses on a broader variety of substrates. However, while MSVD is the desired technique for depositing complex coatings containing one or more coating layers, some materials are not properly deposited using MSVD. In particular, when deposited by MSVD in an 80% oxygen-20% argon environment followed by heating, antimony-doped tin oxide forms a thin film that does not absorb visible light.

It is therefore desirable to provide new solar control coatings that block or filter certain ranges of electromagnetic radiation. It is also desirable to provide methods of applying solar control coatings formed from certain materials that provide improved solar control properties.

SUMMARY OF THE INVENTION

The present invention relates to a coated article comprising a substrate and a coating applied over at least a portion of the substrate. The coating includes at least one metallic layer comprising one or more silver compounds doped with at least one metal selected from Groups 3 to 15 of the periodic table of the elements. For example, the metallic layer can comprise one or more silver compounds doped with at least one metal selected from Groups 4 to 14 of the periodic table of the elements. In some examples, the silver compound is doped with a metal selected from tin, iron, chromium, cobalt, nickel, manganese, copper, gold, zinc, or a combination thereof. The doped silver compound can further comprise at least 50% silver, based on the total solids weight of the doped silver compound.

The coating of the present invention can further comprise at least two separate dielectric layers such that the metallic layer is positioned between the two separate dielectric layers. In some examples, at least one primer layer applied over the metallic layer. The primer layer can be formed from a material comprising titanium, alloys containing nickel and chromium, silicon, silicon dioxide, silicon nitride, silicon oxynitride, nickel-chromium, zirconium, aluminum, alloys of silicon and aluminum, alloys containing cobalt and chromium, or combinations thereof.

The metallic layer can also comprise a continuous metallic layer or a discontinuous layer. The coating can also comprise at least one additional metallic layer. The additional metallic layer can be formed from a material comprising gold, copper, silver, aluminum, or combinations thereof. Moreover, in some examples, the substrate is glass such as an insulated glass unit.

The coating of the present invention can also include: a first dielectric layer formed over at least a portion of the substrate; a first metallic layer formed over at least a portion of the first dielectric layer; a second dielectric layer formed over at least a portion of the first metallic layer; a second metallic layer formed over at least a portion of the second dielectric layer; and a third dielectric layer formed over at least a portion of the second metallic layer. Further, at least one of the metallic layers is formed from a material comprising one or more silver compounds doped with at least one metal selected from Groups 3 to 15 of the periodic table of the elements. Also, at least one of the metallic layers can be a continuous metallic layer or a discontinuous metallic layer. In some examples, a third metallic layer is formed over the third dielectric layer and a fourth dielectric layer is formed over at least a portion of the third metallic layer. In addition, at least one primer layer can be formed over at least one of the metallic layers.

The present invention also includes a coated article comprising: a substrate and a coating applied over at least a portion of the substrate in which the coating comprises one or more metallic layers and one or more dielectric layers. Further, at least one of the dielectric layers comprises a capsule comprising a first silicon nitride film, a metal layer formed over at least a portion of the first silicon nitride film, and a second silicon nitride film formed over at least a portion of the metal layer.

The metal layer formed over at least a portion of the first silicon nitride film can comprise a material that absorbs at least a portion of electromagnetic radiation passing through the coating. For example, the metal layer formed over at least a portion of the first silicon nitride film can comprise titanium, silicon, silicon dioxide, nickel-chromium alloys, zirconium, aluminum, alloys of silicon and aluminum, alloys containing cobalt and chromium, or combinations thereof. In some examples, the metal layer formed over at least a portion of the first silicon nitride film comprises nickel-chromium alloys, alloys containing cobalt and chromium, or combinations thereof. Moreover, at least one of the metallic layers can be a discontinuous metallic layer and/or a continuous metallic layer. The metal layer can also be a sub-oxide or a sub-nitride. For example, the metal layer can be a silicon sub-nitride, a nickel sub-nitride, or a silicon-nickel sub-nitride.

The coated article can also comprise an overcoat. The overcoat can include a capsule comprising a first silicon nitride film, a metal layer formed over at least a portion of the first silicon nitride film, and a second silicon nitride film formed over at least a portion of the metal layer.

The present invention can further include a coated article comprising a substrate and a coating applied over at least a portion of the substrate in which the coating comprises: a first dielectric layer formed over at least a portion of the substrate; a first metallic layer formed over at least a portion of the first dielectric layer; a second dielectric layer formed over at least a portion of the first metallic layer; a second metallic layer formed over at least a portion of the second dielectric layer; a third dielectric layer formed over at least a portion of the second metallic layer, and an overcoat formed over at least a portion of the third dielectric layer. Further, at least one of the dielectric layers and/or the overcoat comprises a capsule comprising a first silicon nitride film, a metal layer formed over at least a portion of the first silicon nitride film, and a second silicon nitride film formed over at least a portion of the metal layer.

The coating can further include a third metallic layer formed over the third dielectric layer and a fourth dielectric layer formed over at least a portion of the third metallic layer. In such examples, the overcoat is formed over at least a portion of the fourth dielectric layer.

The present invention is also directed to a process of forming an antimony-doped tin oxide coating layer over a substrate. The process includes: (a) applying antimony-doped tin oxide to a substrate in a gaseous atmosphere comprising oxygen and a noble gas using a MSVD coater, wherein the gaseous atmosphere comprises at least 15% oxygen; and (b) heating the coated substrate above a softening point of the substrate. In some examples, the gaseous atmosphere comprises from 15% oxygen to 25% oxygen. In another example, the gaseous atmosphere comprises greater than 25% oxygen. Further, the noble gas used in the present method can be argon.

Moreover, the antimony-doped tin oxide can comprise from 20 weight % to 80 weight % tin oxide based on the total weight of the antimony-doped tin oxide. The ratio of antimony to tin oxide can also be selected within a weight ratio range of from 40:60 to 60:40 of antimony to tin oxide.

The process is also conducted under various conditions. For example, the antimony-doped tin oxide can be applied at a pressure within a range of from 1 mTorr to 3 mTorr, at room temperature. The voltage of a MSVD device can also be controlled to provide the oxygen percentage. For example, the voltage can be selected such that the gaseous atmosphere is maintained in a transition mode.

In some examples, the substrate is glass and the coated substrate is heated to a temperature of at least 800° F. Further, the antimony-doped tin oxide coating layer can absorb at least 3% visible light. The antimony-doped tin oxide coating layer can also transmit neutral and/or blue light.

DESCRIPTION OF THE INVENTION

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Further, as used herein, the terms "formed over", "deposited over", or "provided over" mean formed, deposited, or provided on but not necessarily in contact with the surface. For example, a coating layer "formed over" a substrate does not preclude the presence of one or more other coating layers or films of the same or different composition located between the formed coating layer and the substrate.

Additionally, all documents, such as, but not limited to, issued patents and patent applications, referred to herein are to be considered to be "incorporated by reference" in their entirety. As used herein, the term "film" refers to a coating region of a desired or selected coating composition. A "layer" can comprise one or more "films", and a "coating" or "coating stack" can comprise one or more "layers". The term "critical thickness" means a thickness above which a coating material forms a continuous, uninterrupted layer and below which the coating material forms discontinuous regions or islands of the coating material rather than a continuous layer. The term "subcritical thickness" means a thickness below the critical thickness such that the coating material forms isolated, non-connected regions of the coating material. The term "islanded" means that the coating material is not a continuous layer but, rather, that the material is deposited to form isolated regions or islands.

The term "silicon nitride" means and includes a compound having a silicon atom and a nitrogen atom. It may include stoichiometric amounts of silicon and nitrogen, such as $Si_3N_4$, or $Si_yN_z$ where $2.9 \leq v \leq 3.1$ and $3.9 \leq z \leq 4.1$ and may further include aluminum (i.e. $Si_xAl_yN_z$). It also includes non-stoichiometric amounts of silicon and nitrogen, such as $Si_yN_z$ where $0.5 \leq v \leq 3.1$ and $0.5 \leq z \leq 4.1$.

The terms "metal" and "metal oxide" include silicon and silica, respectively, as well as traditionally recognized metals and metal oxides, even though silicon may not be conventionally considered a metal.

For purposes of the following detailed description, it is to be understood that the invention may assume various alternative variations and step sequences, except where expressly specified to the contrary. Moreover, other than in any operating examples, or where otherwise indicated, all numbers expressing, for example, quantities of ingredients used in the specification and claims are to be understood as being modified in all instances by the term "about". Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

In this application, the use of the singular includes the plural and plural encompasses singular, unless specifically stated otherwise. In addition, in this application, the use of "or" means "and/or" unless specifically stated otherwise, even though "and/or" may be explicitly used in certain instances. Further, in this application, the use of "a" or "an" means "at least one" unless specifically stated otherwise.

Further, as used herein, the terms "formed over", "deposited over", or "provided over" mean formed, deposited, or provided on but not necessarily in contact with the surface. For example, a coating layer "formed over" a substrate does not preclude the presence of one or more other coating layers or films of the same or different composition located between the formed coating layer and the substrate.

Moreover, the terms "polymer" or "polymeric" include oligomers, homopolymers, copolymers, and terpolymers, e.g., polymers formed from two or more types of monomers or polymers. The terms "visible region" or "visible light" refer to electromagnetic radiation having a wavelength in the range of 380 nm to 800 nm. The terms "infrared region" or "infrared radiation" refer to electromagnetic radiation having a wavelength in the range of greater than 800 nm to 100,000 nm. The terms "ultraviolet region" or "ultraviolet radiation" mean electromagnetic energy having a wavelength in the range of 300 nm to less than 380 nm.

As used herein, the term "film" refers to a coating region of a desired or selected coating composition. A "layer" can comprise one or more "films", and a "coating" or "coating stack" can comprise one or more "layers". The term "critical thickness" means a thickness above which a coating material forms a continuous, uninterrupted layer and below which the coating material forms discontinuous regions or islands of the coating material rather than a continuous layer. The term "subcritical thickness" means a thickness below the critical thickness such that the coating material forms isolated, non-connected regions of the coating material. The term "islanded" means that the coating material is not a continuous layer but, rather, that the material is deposited to form isolated regions or islands.

As indicated, the present invention relates to solar control coatings applied to a substrate. As used herein, the term "solar control coating" refers to a coating comprised of one or more layers or films that affect the solar properties of the coated article, such as, but not limited to, the amount of solar radiation, for example, visible, infrared, or ultraviolet radiation, reflected from, absorbed by, or passing through the coated article; shading coefficient; emissivity, etc. The solar control coating can block, absorb, or filter selected portions of the solar spectrum, such as, but not limited to, the IR, UV, and/or visible spectrums.

The solar control coatings are typically applied to substrates which exhibit some degree of transparency to visible light, such as float glass or polymeric materials, which can be incorporated into a glazing system such as an insulating glass unit (IGU). It is appreciated that the solar control coatings of the present invention can be practiced with various types of substrates. For example, the solar control coatings of the present invention can be applied to laminated or non-laminated residential and/or commercial windows, insulating glass units, and/or transparencies for land, air, space, above water, and underwater vehicles. Other non-limiting examples of suitable substrates include metal substrates including, but not limited to, steel, galvanized steel, stainless steel, and aluminum; ceramic substrates; tile substrates; plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); or mixtures or combinations of any of the above.

As previously described, the substrate can include a transparent substrate. It is appreciated that while a typical transparent substrate can have sufficient visible light transmission such that materials can be viewed through the transparency, the transparency needs not be transparent to visible light but may be translucent or opaque. In addition, the transparency of the substrate can exhibit any desired visible light, infrared radiation, or ultraviolet radiation transmission and/or reflection. For example, the substrate can have a visible light transmission of any desired amount, e.g., greater than 0% and up to 100%.

In some examples, the substrate is a conventional insulating glass unit. Examples of such substrates are described in U.S. Application Publication No. 2011/0236715, which is incorporated by reference herein in its entirety. For instance, and as described in U.S. Application Publication No. 2011/0236715, the substrate is a conventional insulating glass unit that includes a first ply with a first major surface and an opposed second major surface. The substrate can also include a second ply having an outer (first) major surface and an inner (second) major surface and which is spaced from the first ply. The first and second plies can be connected together in any suitable manner, such as by being adhesively bonded to a conventional spacer frame. A gap or chamber is formed between the two plies. The chamber can be filled with a selected atmosphere, such as air, or a non-reactive gas such as argon or krypton gas. Non-limiting examples of insulating glass units are also described in U.S. Pat. Nos. 4,193,236; 4,464,874; 5,088,258; and 5,106,663, which are incorporated by reference herein in their entireties.

When an insulating glass unit is used, the plies can be of the same or different materials. For example, one or more of the plies can be transparent or translucent to visible light. As used herein, the term "translucent" refers to a substrate that allows electromagnetic energy (e.g., visible light) to pass through but which diffuses the energy such that objects on the side opposite are not clearly visible to the viewer. For example, one or more of the plies can include conventional soda-lime-silicate glass, borosilicate glass, or leaded glass. The glass can be clear glass such as non-tinted or non-colored glass. Alternatively, the glass can be tinted or otherwise colored glass. The glass can be annealed or heat-treated glass. As used herein, the term "heat treated"

means tempered or at least partially tempered. The glass can be of any type, such as conventional float glass, and can be of any composition having any optical properties, e.g., any value of visible transmission, ultraviolet transmission, infrared transmission, and/or total solar energy transmission. Further, as used herein, the term "float glass" refers to glass formed by a conventional float process in which molten glass is deposited onto a molten metal bath and controllably cooled to form a float glass ribbon. Examples of float glass processes are disclosed in U.S. Pat. Nos. 4,466,562 and 4,671,155, which are incorporated by reference herein in their entireties.

As indicated, a solar control coating is deposited over at least a portion of the substrate. For example, a solar control coating can be deposited over at least a portion of at least one major surface of one of the glass plies of an insulating glass unit. In accordance with the present invention, the solar control coating includes at least one metallic layer comprising one or more silver compounds doped with at least one metal selected from Groups 3 to 15 (International Union of Pure and Applied Chemistry (IUPAC)) of the periodic table of the elements, or from Groups 4 to 14 (International Union of Pure and Applied Chemistry (IUPAC)) of the periodic table of the elements. Thus, the present invention includes a substrate, such as a transparent substrate, at least partially coated with a solar control coating comprising at least one metallic layer comprising one or more silver compounds doped with at least one metal selected from Groups 3 to 15, or Groups 4 to 14 (International Union of Pure and Applied Chemistry (IUPAC)) of the periodic table of the elements. For example, the present invention includes a substrate, such as a transparent substrate, at least partially coated with a solar control coating comprising at least one metallic layer comprising one or more silver compounds doped with at least one metal selected from tin, iron, chromium, cobalt, nickel, manganese, copper, gold, and zinc.

As used herein, a "doped silver compound", with respect to a coating layer, refers to a coating layer formed with a silver compound and at least one other material added to the coating layer. Therefore, a metallic layer comprising a silver compound doped with at least one metal selected from Groups 3 to 15, or Groups 4 to 14, refers to a coating layer formed from a silver compound and at least one metal selected from Groups 3 to 15, or Groups 4 to 14.

Further, the silver based metallic layer can comprise at least 50 weight % silver, or least 60 weight % silver, or at least 70 weight % silver, or at least 80 weight % silver, or at least 90 weight % silver, or at least 95 weight % silver, or at least 98 weight % silver, or at least 99 weight % silver, based on the total solids weight of the silver based metallic coating layer. As such, the silver based metallic layer can comprise 50 weight % or less of one or more metals selected from Groups 3 to 15 or Groups 4 to 14, or 40 weight % or less of one or more metals selected from Groups 3 to 15 or Groups 4 to 14, or 30 weight % or less of one or more metals selected from Groups 3 to 15 or Groups 4 to 14, or 20 weight % or less of one or more metals selected from Groups 3 to 15 or Groups 4 to 14, or 10 weight % or less of one or more metals selected from Groups 3 to 15 or Groups 4 to 14, or 5 weight % or less of one or more metals selected from Groups 3 to 15 or Groups 4 to 14, or 2 weight % or less of one or more metals selected from Groups 3 to 15 or Groups 4 to 14, or 1 weight % or less of one or more metals selected from Groups 3 to 15 or Groups 4 to 14, based on the total solids weight of the silver based metallic coating layer.

The doped silver based metallic layer can also include additional materials. For instance, the doped silver based metallic layer can also comprise an additional metal element that is not doped with the silver metal but is added therewith during initial application of the silver metal. The doped silver based metallic layer can also comprise an additional metal element that is not that is not from Groups 3 to 15. Alternatively, the doped silver based metallic layer only comprise silver dope with one or more metals selected from Groups 3 to 15. As such, in some examples, the doped silver based metallic layer is free of materials other than silver and the one or more doped metals from Groups 3 to 15.

The previously described doped silver based metallic layer can be deposited to form a continuous layer or a discontinuous layer. As used herein, a "continuous layer" refers to a coating layer that forms a continuous film of the material and which does not have isolated coating regions. In contrast, a "discontinuous layer" refers to a coating layer that forms a discontinuous film of the material and which does include isolated coating regions. It is appreciated that the doped silver based metallic layer can be deposited below a critical thickness (also referred to as "subcritical layers") to form discontinuous regions or islands of the discontinuous layer rather than a continuous layer. These discontinuous layers absorb electromagnetic radiation through an effect known as surface Plasmon resonance. These subcritical layers typically have higher absorbance in the visible region than a continuous layer of the same material and also have lower solar energy reflectance.

It was found that that adding one or more metals selected from Groups 3 to 15 (International Union of Pure and Applied Chemistry (IUPAC)) of the periodic table of the elements further increases the absorption of both unheated and tempered silver based coating layers. For example, the addition of at least one metal selected from at least one of tin, iron, chromium, cobalt, nickel, manganese, copper, gold, and zinc was found to increase the absorption of both unheated and tempered silver based coating layers.

As previously described, the solar control coatings of the present invention can comprise additional coating layers. For instance, the solar control coating can comprise two or more metallic layers comprising one or more silver compounds doped with at least one metal selected from Groups 3 to 15, or Groups 4 to 14 (International Union of Pure and Applied Chemistry (IUPAC)) of the periodic table of the elements. The solar control coating can also comprise one or more additional coating layers that are different from the at least one metallic layer comprising one or more silver compounds doped with at least one metal selected from Groups 3 to 15, or Groups 4 to 14 (International Union of Pure and Applied Chemistry (IUPAC)) of the periodic table of the elements. For instance, the solar control coating can comprise the previously described doped silver based metallic layer positioned between two separate dielectric layers such as the dielectric layer described in further detail herein. It is appreciated that the solar control coatings can comprise various types of additional coating layers including, but not limited to, primer layers and different metallic layers (subcritical and non-subcritical metallic layers). Such coating layers and combinations of coating layers are described in further detail in U.S. Application Publication No. 2011/0236715, which is incorporated by reference herein in its entirety.

In some examples, the solar control coating can comprise a base layer or first dielectric layer deposited over at least a portion of a surface of the substrate. The first dielectric layer can be a single layer or can comprise more than one film of antireflective materials and/or dielectric materials, such as, but not limited to, metal oxides, oxides of metal alloys, nitrides, oxynitrides, or mixtures thereof. The first dielectric layer can also be transparent to visible light. Non-limiting examples of suitable metal oxides for the first dielectric layer include oxides of titanium, hafnium, zirconium, niobium, zinc, bismuth, lead, indium, tin, or mixtures thereof. These metal oxides can have small amounts of other materials, such as manganese in bismuth oxide, tin in indium oxide, etc. Additionally, oxides of metal alloys or metal mixtures can be used, such as oxides containing zinc and tin (e.g., zinc stannate), oxides of indium-tin alloys, silicon nitrides, silicon aluminum nitrides, or aluminum nitrides. Further, doped metal oxides, such as antimony or indium doped tin oxides or nickel or boron doped silicon oxides, can be used. The first dielectric layer can be a substantially single phase film, such as a metal alloy oxide film, e.g., zinc stannate, or can be a mixture of phases composed of zinc and tin oxides or can be composed of a plurality of films.

Further, the first dielectric layer (whether a single film or multiple film layer) can have a thickness in the range of 100 Å to 600 Å, such as 200 Å to 500 Å, such as 250 Å to 350 Å, such as 250 Å to 310 Å, such as 280 Å to 310 Å, such as 300 Å to 330 Å, such as 310 Å to 330 Å.

As previously noted, the first dielectric layer can comprise a multi-film structure. For example, the first dielectric layer can comprise a multi-film structure having a first film, e.g., a metal alloy oxide film, deposited over at least a portion of the substrate and a second film, e.g., a metal oxide or oxide mixture film, deposited over the first metal alloy oxide film. A non-limiting example of a first dielectric layer comprising a multi-film structure is described in U.S. Application Publication No. 2011/0236715 at paragraphs [0036] to [0039], which is incorporated by reference herein.

The solar control coating can comprise a first metallic layer deposited over the first dielectric layer. The first metallic layer can include a reflective or non-reflective metal, such as, but not limited to, metallic gold, copper, palladium, aluminum, silver, or mixtures, alloys, or combinations thereof. The first metallic layer can also comprise the previously described silver based metallic layer doped with at least one metal selected from Groups 3 to 15 (International Union of Pure and Applied Chemistry (IUPAC)) of the periodic table of the elements, or from Groups 4 to 14 (International Union of Pure and Applied Chemistry (IU-PAC)) of the periodic table of the elements. In some examples, the first metallic layer is a continuous layer. Alternatively, the first metallic layer is a discontinuous layer.

The solar control coatings can further comprise a first primer layer located over the first metallic layer. The first primer layer can be a single film or a multiple film layer. The first primer layer can include an oxygen-capturing material that can be sacrificial during the deposition process to prevent degradation or oxidation of the first reflective layer during the sputtering process or subsequent heating processes. The first primer layer can also absorb at least a portion of electromagnetic radiation, such as visible light, passing through the coating. Non-limiting examples of materials suitable for the first primer layer include titanium, silicon, silicon dioxide, silicon nitride, silicon oxynitride, nickel-chrome alloys (such as Inconel), zirconium, aluminum, alloys of silicon and aluminum, alloys containing cobalt and chromium (e.g., Stellite®), and/or mixtures thereof. For example, the first primer layer can be titanium and can have a thickness in the range of 5 Å to 50 Å, e.g., 10 Å to 40 Å, e.g., 20 Å to 40 Å, e.g., 20 Å to 35 Å.

A second dielectric layer can also be deposited over the first metallic layer (e.g., over the first primer layer). The second dielectric layer can comprise one or more metal oxide or metal alloy oxide-containing films, such as those described above with respect to the first dielectric layer. The second dielectric layer can have a total thickness (e.g., the combined thicknesses of the layers) in the range of 50 Å to 1000 Å, e.g., 50 Å to 500 Å, e.g., 100 Å to 370 Å, e.g., 100 Å to 300 Å, e.g., 100 Å to 200 Å, e.g., 150 Å to 200 Å, e.g., 180 Å to 190 Å.

Moreover, a second metallic layer can be deposited over the second dielectric layer. The metallic material can comprise any of the previously described metallic layers such as the previously described silver compound or compounds doped with at least one metal selected from Groups 3 to 15 (International Union of Pure and Applied Chemistry (IU-PAC)) of the periodic table of the elements, or from Groups 4 to 14 (International Union of Pure and Applied Chemistry (IUPAC)) of the periodic table of the elements. The metallic material can also be applied at a subcritical thickness such that isolated regions or islands of the material are formed. Alternatively, the metallic material can deposited to form a continuous layer.

A second primer layer can be deposited over the second metallic layer. The second primer layer can be as described above with respect to the first primer layer. In one example, the second primer layer can be a nickel-chromium alloy (such as Inconel) having a thickness in the range of 5 Å to 50 Å, e.g., 10 Å to 25 Å, e.g., 15 Å to 25 Å, e.g., 15 Å to 22 Å. It is appreciated that different primers (e.g., having different refractive indices) can provide the coating with different absorbance spectra and, hence, with different colors.

A third dielectric layer can be deposited over the second metallic layer (e.g., over the second primer film). The third dielectric layer can also include one or more metal oxide or metal alloy oxide-containing layers, such as discussed above with respect to the first and second dielectric layers. In one example, the third dielectric layer is a multi-film layer similar to the second dielectric layer. For example, both of the zinc oxide layers are present in the third dielectric layer and each has a thickness in the range of 50 Å to 200 Å, such as 75 Å to 150 Å, such as 80 Å to 150 Å, such as 95 Å to 120 Å. The metal alloy oxide layer can have a thickness in the range of 100 Å to 800 Å, e.g., 200 Å to 700 Å, e.g., 300 Å to 600 Å, e.g., 380 Å to 500 Å, e.g., 380 Å to 450 Å.

A third metallic layer can be deposited over the third dielectric layer. The third reflective layer can be of any of the materials discussed above with respect to the first metallic layer. In one non-limiting example, the third reflective layer includes silver and has a thickness in the range of 25 Å to 300 Å, e.g., 50 Å to 300 Å, e.g., 50 Å to 200 Å, such as 70 Å to 151 Å, such as 100 Å to 150 Å, such as 137 Å to 150 Å. The third metallic layer can also be a continuous or discontinuous layer.

A third primer layer is located over the third metallic layer. The third primer layer can be as described above with respect to the first or second primer layers. In one non-limiting example, the third primer layer is titanium and has a thickness in the range of 5 Å to 50 Å, e.g., 10 Å to 33 Å, e.g., 20 Å to 30 Å.

In addition, a fourth dielectric layer can be located over the third metallic layer (e.g., over the third primer layer). The fourth dielectric layer can be comprised of one or more metal oxide or metal alloy oxide-containing layers, such as those discussed above with respect to the first, second, or third dielectric layers. In one non-limiting example, the fourth dielectric layer is a multi-film layer having a first metal oxide layer, e.g., a zinc oxide layer, deposited over the third primer film, and a second metal alloy oxide layer, e.g., a zinc stannate layer, deposited over the zinc oxide layer. The zinc oxide layer can have a thickness in the range of 25 Å to 200 Å, such as 50 Å to 150 Å, such as 60 Å to 100 Å, such as 80 Å to 90 Å. Further, the zinc stannate layer can have a thickness in the range of 25 Å to 500 Å, e.g., 50 Å to 500 Å, e.g., 100 Å to 400 Å, e.g., 150 Å to 300 Å, e.g., 150 Å to 200 Å, e.g., 170 Å to 190 Å.

An overcoat can be located over the fourth dielectric layer. The overcoat can help protect the underlying coating layers from mechanical and chemical attack. The overcoat can be, for example, a metal oxide or metal nitride layer. For example, the overcoat can be titania having a thickness in the range of 10 Å to 100 Å, such as 20 Å to 80 Å, such as 30 Å to 50 Å, such as 30 Å to 45 Å. Other materials useful for the overcoat include other oxides, such as silica, alumina, or a mixture of silica and alumina.

When used alone or in a multi-layer layer coating stack, the metallic layer comprising one or more silver compounds doped with at least one metal selected from Groups 3 to 15, or Groups 4 to 14 (International Union of Pure and Applied Chemistry (IUPAC)) of the periodic table of the elements increases the visible light absorbance of the coating. It is appreciated that one or more of the any of the previously described metallic layer can comprise the silver metallic layer doped with at least one metal selected from Groups 3 to 15. Further, the combination of the metallic layers with selected thicknesses of the dielectric layers can provide the coated article with an asymmetrical reflectance. The color of the article can also be tuned in transmission by changing the primer(s) used in the coating. Also, the coating of the invention is able to be heat treated without introducing haze.

It is to be understood that any of the metallic layers can be a continuous layer or a discontinuous layer in a coating stack when used. For example, for coating stacks having a plurality of metallic coating layers, more than one of the metallic layers could be a discontinuous subcritical metallic layer or a continuous metallic layer.

In addition, at least one of the previously described layers can include or be substituted for another material in order to adjust the properties of the final coating. For example, at least one of the previously described dielectric layers, primer layers, and/or overcoat can comprise or be formed from a capsule comprising a first silicon nitride film, a metal layer formed over at least a portion of the first silicon nitride film, and a second silicon nitride film formed over at least a portion of the metal layer. The metal layer can absorb at least a portion of electromagnetic radiation, such as visible light, passing through the coating. As such, the metal layer can act as an absorbing layer.

The metal layer formed over at least a portion of the first silicon nitride film can comprise any metal from Groups 3-15 of the Periodic Table. For example, the metal layer can comprise titanium, silicon, silicon dioxide, nickel-chromium alloys, zirconium, aluminum, alloys of silicon and aluminum, alloys containing cobalt and chromium, or mixtures thereof. In some examples, the metal layer formed over at least a portion of the first silicon nitride film comprises nickel-chromium alloys, alloys containing cobalt and chromium, or mixtures thereof. It is appreciated that the metal layer formed over at least a portion of the first silicon nitride film is different from the first and second silicon nitride films. In another examples, the metal layer comprises a sub-oxide or sub-nitride compound of any of the metal from Group 3-15 of the Periodic Table. For instance, the metal layer formed over at least a portion of the first silicon nitride film can be completely free of silicon nitride. The metal layer comprises a continuous film or a discontinuous film (for example a sub-critical silver film, a sub-critical copper film, or a mixture of sub-critical silver and sub-critical copper).

The previously described capsule can be used in at least one of the layers of the coating stack to provide good electromagnetic radiation, such as visible light absorption, after heating. Further, when used as an overcoat layer, the capsule can also improve the durability of the coating.

It is appreciated that the capsule comprising a first silicon nitride film, a metal layer formed over at least a portion of the first silicon nitride film, and a second silicon nitride film formed over at least a portion of the metal layer can be placed in different areas of the coating stack to provide different properties. For example, when the capsule is placed in the bottom of the coating stack, the coating exhibits certain color properties that are different from the color properties exhibited in a coating where the capsule is positioned in the top of the coating stack such as in the overcoat. As such, the area in which the capsule is placed in the coating stack is important for providing a desired property in the coating such as color for example.

The solar control coatings can be deposited by any conventional method, such as, but not limited to, conventional chemical vapor deposition (CVD) and/or physical vapor deposition (PVD) methods. Examples of CVD processes include spray pyrolysis. Examples of PVD processes include electron beam evaporation and vacuum sputtering (such as magnetron sputter vapor deposition (MSVD)). Other coating methods could also be used, such as, but not limited to, sol-gel deposition. The layers can be deposited in metallic mode, transition mode or reactive mode. By reactive mode, the metal that is deposited can be deposited as an oxide or as a nitride.

As previously indicated, the present invention is also directed to improved methods of applying solar control coatings to provide improved solar control properties. In particular, the present invention provides improved MSVD methods of applying solar control coatings comprising antimony-doped tin oxide.

MSVD processes are typically performed in coaters having one or more coating zones. Each zone includes one or more targets for depositing a specific type of material on a substrate. Each target is placed in a bay which has its own gas feeds by which gas comes into the zone. Although gas comes into a zone in different places, all of the gas that comes into the zone leaves at a certain place in the zone. The gases used during the deposition process include reactive and/or non-reactive gasses. Non-limiting examples of reactive gases that are commonly used include hydrogen, oxygen, nitrogen, and combinations thereof. Moreover, non-limiting examples of non-reactive gases that are commonly used include one or more noble gases such as argon.

Each zone in a coater is run, i.e. operated to deposit a coating layer, in one of three modes-metal mode, transition mode, or oxide mode. It is appreciated that the amount of reactive gas that is capable of reacting with a target in the zone determines the mode. For instance, the transition mode can occur by increasing the reactive gas, such as oxygen, to a particular percentage range which can deposit substantially metal oxides and/or sub-oxides.

Further, MSVD methods can use one or more zones that are each independently run in one or more modes. For example, a MSVD method can comprise multiple zones that are each independently run in a single mode such as metal mode. Alternatively, the MSVD method can comprise one or more zones in which at least one of zones is run using multiple modes such as metal mode and transition or oxide mode. Examples of MSVD methods that use multiple modes in at least one zone are described in U.S. Pat. No. 8,500,965, which is incorporated by reference herein in its entirety.

As previously described, MSVD processes are especially suited for complex coatings containing one or more coating layers because they allow for a wider selection of coating materials to be deposited at thinner thicknesses on a broader variety of substrates; however, some materials deposited using MSVD do not exhibit the properties desired in a solar control coating. For instance, when deposited by MSVD followed by heating, antimony-doped tin oxide forms a thin film that does not absorb visible light.

In accordance with the present invention, it was found that the deposition of antimony-doped tin oxide over a substrate in a gaseous atmosphere comprising oxygen and a noble gas using a MSVD coater in which the gaseous atmosphere comprises at least 15% oxygen produces a film that absorbs visible light after heating the coated substrate above a softening point of the substrate. For example, by depositing antimony-doped tin oxide using MSVD in a gaseous atmosphere comprising a noble gas and at least 15% oxygen followed with heating of the coated substrate above a softening point of the substrate, a film can be produced with improved visible light absorption.

As previously described, the MSVD method of depositing antimony-doped tin oxide using a gaseous atmosphere comprising a noble gas and at least 15% oxygen provides an improved visible light absorbing film. In some examples, the antimony-doped tin oxide is deposited using MSVD in a gaseous atmosphere comprising a noble gas and from 15% oxygen to 25% oxygen. With respect to the present invention, a gaseous atmosphere comprising a noble gas and from 15% oxygen to 25% oxygen to deposit antimony-doped tin oxide is considered to be within the transition mode. In other examples, the antimony-doped tin oxide is deposited using MSVD in a gaseous atmosphere comprising a noble gas and greater than 25% oxygen, such as greater than 30% oxygen or greater than 40% oxygen or greater than 50% oxygen or up to 80% oxygen. With respect to the present invention, a gaseous atmosphere comprising a noble gas and greater than 25% oxygen to deposit antimony-doped tin oxide is considered to be within the metal mode, which is also referred to as the reactive mode.

It is appreciated that one or more noble gases make up the remaining amount of the gaseous atmosphere. For example, the remaining amount of the gaseous atmosphere can comprise argon. As such, the gaseous atmosphere used during deposition of antimony-doped tin oxide can comprise less than 85% of the noble gas such as argon, or 70% or less of the noble gas such as argon, or 60% or less of the noble gas such as argon, or 50% or less of the noble gas such as argon, or 40% or less of the noble gas such as argon, or 30% or less of the noble gas such as argon, or 20% or less of the noble gas such as argon.

It is further appreciated that the gaseous atmosphere during deposition can be based on a weight ratio of oxygen to noble gas. In some examples, the weight ratio of oxygen to noble gas, such as oxygen to argon for example, used for deposition of the antimony-doped tin oxide is selected within a range of from 20:80 to 80:20 of oxygen to noble gas, or from 40:60 to 60:40 of oxygen to noble gas, or from 40:60 to 50:50 of oxygen to noble gas, or at a weight ratio of 40:60 oxygen to noble gas.

The antimony-doped tin oxide material applied to the substrate using MSVD also comprises a certain amount of antimony and a certain amount of tin oxide. In some examples, the antimony-doped tin oxide used with the present invention comprises from 20 weight % to 80 weight % tin oxide, or from 20 weight % to 80 weight % tin oxide, based on the total weight of the antimony-doped tin oxide. The antimony-doped tin oxide used with the present invention can also comprise from 40 weight % to 60 weight % tin oxide, or from 45 weight % to 55 weight % tin oxide, or 50 weight % tin oxide, based on the total weight of the antimony-doped tin oxide.

It is appreciated that antimony makes up the remaining amount of the antimony-doped tin oxide. For example, the remaining amount of the antimony-doped tin oxide can comprise from 20 weight % to 80 weight % antimony, or from 40 weight % to 60 weight % antimony, or from 45 weight % to 55 weight % antimony, or 50 weight % antimony, based on the total weight of the antimony-doped tin oxide.

It is further appreciated that the chemical composition of the antimony-doped tin oxide can also be based on a weight ratio of antimony to tin oxide. In some examples, the weight ratio of antimony to tin oxide is selected within a range of from 20:80 to 80:20 of antimony to tin oxide, or from 40:60 to 60:40 of antimony to tin oxide, or 50:50 antimony to tin oxide.

Various parameters can also be varied during application of the antimony-doped tin oxide to the substrate using MSVD. For instance, it has been found that controlling the voltage of the MSVD process helps deposit or sputter substantially metal sub-oxide and/or metal oxide materials in a transition mode. By controlling the voltage, the feed rate of oxygen is controlled so as to maintain a stable, high sputtering rate while depositing substantially metal oxide and/or metal sub-oxide materials.

Various methods can be used to control the voltage to provide the transition mode. For example, in one method, the voltage is controlled to provide the transition mode by selecting a cathode voltage typical of the metallic or sub-metallic regime, and monitoring the difference between this selected cathode voltage and the actual cathode voltage for the process. This difference in voltage is used as the input to an electromechanical valve that admits more or less oxygen gas to the deposition or sputtering chamber depending on the size of the voltage difference. The resulting voltage controls the MSVD process to provide the transition mode which allows for the deposition of a substantially metal oxide and/or metal sub-oxide material in a stable manner and, in particular, the deposition of antimony-doped tin oxide from a metallic antimony/tin alloy target in transition mode. The resulting voltage also helps control the proportion of sub-oxide and metal oxide material deposited, without allowing the process change irreversibly into the oxide sputtering regime simply due to natural process variation.

Other parameters that can be changed include, but are not limited, pressure and temperature. In some examples, the antimony-doped tin oxide is applied to the substrate at a pressure within a range of from 0.1 mTorr to 100 mTorr, preferably 0.5 mTorr to 50 mTorr, more preferably 0.75 mTorr to 10 mTorr, most preferably 1 mTorr to 3 mTorr, and at room temperature (i.e., the temperature of the surrounding environment).

As previously noted, after depositing the antimony-doped tin oxide over the substrate, the coated substrate is heated above the softening point of the substrate. As used herein, the "softening point", with respect to the coated substrate, refers to the temperature at which the substrate becomes moldable, deformable, or otherwise capable of being changed from its original physical form. In some examples, the coated substrate is heated at temperature of at least 800° F., or at least 900° F., or at least 1000° F., or at least 1100° F.

Further, the substrate used with the present invention can include any of the substrates previously described. For instance, the substrate coated with the antimony-doped tin oxide can be chosen from a glass substrate including, but not limited to, an insulated glass unit. Thus, it is appreciated that the antimony-doped tin oxide coating layer can be used in a multi-layer coating that includes one or more of the additional coating layers previously described.

As indicated, the previously described MSVD method produces an antimony-doped tin oxide coating layer that absorbs visible light. For instance, the antimony-doped tin oxide coating layer produced by the previously described MSVD method can absorb at least 3% visible light, such as at least 5% visible light, or at least 10% visible light, or at least 25% visible light, or at least 50% visible light. In addition, the antimony-doped tin oxide coating layer can also transmit neutral and/or blue light.

The present invention is also directed to the following clauses.

Clause 1: A coated article comprising: a substrate; and a coating applied over at least a portion of the substrate, the coating comprising at least one metallic layer, wherein the metallic layer comprises one or more silver compounds doped with at least one metal selected from groups 3 to 15 of the periodic table of the elements.

Clause 2: The coated article according to clause 1, wherein the metallic layer comprises one or more silver compounds doped with at least one metal selected from groups 4 to 14 of the periodic table of the elements.

Clause 3: The coated article according to clause 1, wherein the silver compound is doped with a metal selected from tin, iron, chromium, cobalt, nickel, manganese, copper, gold, zine, or a combination thereof.

Clause 4: The coated article according to any of clauses 1 to 3, wherein the doped silver compound comprises at least 50% silver, based on the total solids weight of the doped silver compound.

Clause 5: The coated article according to any of clauses 1 to 4, wherein the coating further comprises at least two separate dielectric layers, and wherein the metallic layer is positioned between the two separate dielectric layers.

Clause 6: The coated article according to any of clauses 1 to 5, further comprising at least one primer layer applied over the metallic layer.

Clause 7: The coated article according to clause 6, wherein the primer layer is formed from a material comprising titanium, alloys containing nickel and chromium, silicon, silicon dioxide, silicon nitride, silicon oxynitride, NiCr, zirconium, aluminum, alloys of silicon and aluminum, alloys containing cobalt and chromium, or combinations thereof.

Clause 8: The coated article according to any of clauses 1 to 7, wherein the metallic layer comprises a continuous metallic layer.

Clause 9: The coated article according to any of clauses 1 to 7, wherein the metallic layer comprises a discontinuous metallic layer.

Clause 10: The coated article according to any of clauses 1 to 9, further comprising at least one additional metallic layer.

Clause 11: The coated article according to clause 10, wherein the continuous metallic layer is formed from a material comprising gold, copper, silver, aluminum, or combinations thereof.

Clause 12: The coated article according to any of clauses 1 to 11, wherein the substrate is glass.

Clause 13: The coated article according to clause 12, wherein the substrate is an insulated glass unit.

Clause 14: A coated article comprising: a substrate; and a coating applied over at least a portion of the substrate, the coating comprising a first dielectric layer formed over at least a portion of the substrate; a first metallic layer formed over at least a portion of the first dielectric layer; a second dielectric layer formed over at least a portion of the first metallic layer; a second metallic layer formed over at least a portion of the second dielectric layer; and a third dielectric layer formed over at least a portion of the second metallic layer, wherein at least one of the metallic layers is formed from a material comprising one or more silver compounds doped with at least one metal selected from Groups 3 to 15 of the periodic table of the elements.

Clause 15: The coated article according to clause 14, wherein at least one of the metallic layers is a continuous metallic layer.

Clause 16: The coated article according to clause 14, wherein at least one of the metallic layers is a discontinuous metallic layer.

Clause 17: The coated article according to clauses 14 to 16, further comprising a third metallic layer formed over at least a portion of the third dielectric layer and a fourth dielectric layer formed over at least a portion of the third metallic layer.

Clause 18: The coated article according to any of clauses 14 to 17, further comprising at least one primer layer formed over at least one of the metallic layers.

Clause 19: The coated article according to any of clauses 14 to 18, wherein the substrate is glass.

Clause 20: The coated article according to clause 19, wherein the substrate is an insulated glass unit.

Clause 21: A coated article comprising: a substrate; and a coating applied over at least a portion of the substrate, the coating comprising one or more metallic layers and one or more dielectric layers, wherein at least one of the dielectric layers comprises a capsule comprising a first silicon nitride film, a metal layer formed over at least a portion of the first silicon nitride film, and a second silicon nitride film formed over at least a portion of the metal layer.

Clause 22: The coated article of clause 21, wherein the metal layer formed over at least a portion of the first silicon nitride film comprises a material that absorbs at least a portion of electromagnetic radiation passing through the coating.

Clause 23: The coated article of clauses 21 or 22, wherein the metal layer formed over at least a portion of the first silicon nitride film comprises titanium, silicon, silicon dioxide, nickel-chromium alloys, zirconium, aluminum, alloys of silicon and aluminum, alloys containing cobalt and chromium, or mixtures thereof.

Clause 24: The coated article of clauses 21 or 22, wherein the metal layer formed over at least a portion of the first silicon nitride film comprises nickel-chromium alloys, alloys containing cobalt and chromium, or mixtures thereof.

Clause 25: The coated article of any of clauses 21 to 24, wherein at least one of the metallic layers is a discontinuous metallic layer.

Clause 26: The coated article of any of clauses 21 to 25, wherein at least one of the metallic layers is a continuous metallic layer.

Clause 27: The coated article of any of clauses 21 to 26, further comprising an overcoat, wherein the overcoat is formed from a capsule comprising a first silicon nitride film, a metal layer formed over at least a portion of the first silicon nitride film, and a second silicon nitride film formed over at least a portion of the metal layer.

Clause 28: A coated article comprising: a substrate; and a coating applied over at least a portion of the substrate, the coating comprising: a first dielectric layer formed over at least a portion of the substrate; a first metallic layer formed over at least a portion of the first dielectric layer; a second dielectric layer formed over at least a portion of the first metallic layer; a second metallic layer formed over at least a portion of the second dielectric layer; a third dielectric layer formed over at least a portion of the second metallic layer, and an overcoat formed over at least a portion of the third dielectric layer, wherein at least one of the dielectric layers and/or the overcoat comprises a capsule comprising a first silicon nitride film, a metal layer formed over at least a portion of the first silicon nitride film, and a second silicon nitride film formed over at least a portion of the metal layer.

Clause 29: The coated article of clause 28, further comprising a third metallic layer formed over at least a portion of the third dielectric layer and a fourth dielectric layer formed over at least a portion of the third metallic layer, wherein the overcoat is formed over at least a portion of the fourth dielectric layer.

Clause 30: The coated article of clauses 28 or 29, wherein the metal layer formed over at least a portion of the first silicon nitride film comprises titanium, silicon, silicon dioxide, nickel-chromium alloys, zirconium, aluminum, alloys of silicon and aluminum, alloys containing cobalt and chromium, or mixtures thereof.

Clause 31: A process of forming an antimony-doped tin oxide coating layer over a substrate comprising: (i) applying antimony-doped tin oxide to a substrate in a gaseous atmosphere comprising oxygen and a noble gas using a MSVD coater, wherein the gaseous atmosphere comprises at least 15% oxygen; and (ii) heating the coated substrate above a softening point of the substrate.

Clause 32: The process of clause 31, wherein the gaseous atmosphere comprises from 15% oxygen to 25% oxygen.

Clause 33: The process of clause 31, wherein the gaseous atmosphere comprises greater than 25% oxygen.

Clause 34: The process of any of clauses 31 to 33, wherein the noble gas is argon.

Clause 35: The process of any of clauses 31 to 34, wherein the antimony-doped tin oxide comprises from 20 weight % to 80 weight % tin oxide based on the total weight of the antimony-doped tin oxide.

Clause 36: The process of any of clauses 31 to 35, wherein a ratio of antimony to tin oxide is selected within a weight ratio range of from 40:60 to 60:40 of antimony to tin oxide.

Clause 37: The process of any of clauses 31 to 36, wherein the antimony-doped tin oxide is applied to the substrate at a pressure within a range of from 0.1 mTorr to 100 mTorr, preferably 0.5 mTorr to 50 mTorr, more preferably 0.75 mTorr to 10 mTorr, most preferably 1 mTorr to 3 mTorr.

Clause 38: The process of any of clauses 31 to 37, wherein the antimony-doped tin oxide is applied to the substrate at room temperature.

Clause 39: The process of any of clauses 31 to 38, wherein the substrate is a glass.

Clause 40: The process of any of clauses 31 to 39, wherein the coated substrate is heated to a temperature of at least 800° F.

Clause 41: The process of any of clauses 31 to 40, wherein a voltage of a MSVD device is controlled to provide the oxygen percentage.

Clause 42: The process of clause 41, wherein the voltage is selected such that the gaseous atmosphere is maintained in a transition mode.

Clause 43: A substrate coated with an antimony-doped tin oxide coating layer prepared by the process according to any of clauses 31 to 42.

Clause 44: The coated substrate of clause 43, wherein the antimony-doped tin oxide coating layer absorbs at least 3% visible light.

Clause 45: The coated substrate of any of clauses 43 to 44, wherein the substrate is glass.

The following examples are presented to demonstrate the general principles of the invention. The invention should not be considered as limited to the specific examples presented. All parts and percentages in the examples are by weight unless otherwise indicated.

The invention claimed is:

1. A coated article comprising:
a substrate; and
a coating applied over at least a portion of the substrate, the coating comprising:
a first dielectric layer formed over at least a portion of the substrate;
a first metallic layer formed directly over at least a portion of the first dielectric layer;
a second dielectric layer formed over at least a portion of the first metallic layer;
a second metallic layer formed directly over at least a portion of the second dielectric layer; and
a third dielectric layer formed over at least a portion of the second metallic layer,
wherein the metallic layers are formed from a material comprising one or more silver compounds doped with at least one metal selected from the group consisting essentially of iron, manganese, or a combination of iron and manganese,
wherein the doped silver compound comprises in the range of 50% to 90% silver based on total solids weight of the doped silver compound, and
wherein each metallic layer in the coating is separated by at least one dielectric layer.

2. The coated article of claim 1, wherein the at least one metallic layer formed from the material comprising one or more silver compounds doped with the at least one metal is a continuous metallic layer.

3. The coated article of claim 1, wherein the at least one metallic layer formed from the material comprising one or more silver compounds doped with the at least one metal is a discontinuous metallic layer.

4. The coated article of claim 1, further comprising a third metallic layer formed over at least a portion of the third dielectric layer and a fourth dielectric layer formed over at least a portion of the third metallic layer.

5. The coated article of claim 1, further comprising a primer layer formed over the first metallic layer and/or the second metallic layer.

6. The coated article of claim 5, wherein a primer layer is formed over each metallic layer.

7. The coated article of claim 5, wherein the primer layers comprise titanium, silicon, silicon dioxide, silicon nitride, silicon oxynitride, nickel-chrome alloys, zirconium, aluminum, alloys of silicon and aluminum, alloys containing cobalt and chromium, or mixtures thereof.

8. The coated article of claim 1, wherein each dielectric layer comprises at least one film comprising a metal oxide.

9. The coated article of claim 8, wherein the metal oxide comprises an oxide of titanium, hafnium, zirconium, niobium, zinc, bismuth, lead, indium, tin, or mixtures thereof.

10. The coated article of claim 8, wherein the dielectric layers comprise at least two different metal oxide films in direct contact with each other.

11. The coated article of claim 1, wherein the doped silver compound comprises 20% or less of the at least one metal doped in the silver compound based on total solids weight of the doped silver compound.

12. The coated article of claim 1, wherein the substrate is glass.

13. The coated article of claim 12, wherein the substrate is an insulated glass unit.

14. A coated article comprising:

an insulated glass unit; and a coating applied over at least a portion of the substrate, the coating comprising:

a first dielectric layer formed over at least a portion of the substrate;

a first metallic layer formed directly over at least a portion of the first dielectric layer;

a first primer layer formed directly over at least a portion of the first metallic layer;

a second dielectric layer formed directly over at least a portion of the primer layer;

a second metallic layer formed directly over at least a portion of the second dielectric layer;

a second primer layer formed directly over at least a portion of the second metallic layer; and a third dielectric layer formed directly over at least a portion of the second primer layer, wherein the metallic layers are formed from a material comprising one or more silver compounds doped with at least one metal selected from the group consisting essentially of iron, manganese, or a combination of iron and manganese, wherein the doped silver compound comprises in the range of 50% to 90% silver based on total solids weight of the doped silver compound, and wherein at least one of the metallic layers is a discontinuous layer.

15. The coated article of claim 14, wherein the at least one metallic layer formed from the material comprising one or more silver compounds doped with the at least one metal is a continuous metallic layer.

16. The coated article of claim 14, wherein the at least one metallic layer formed from the material comprising one or more silver compounds doped with the at least one metal is a discontinuous metallic layer.

17. The coated article of claim 14, further comprising a third metallic layer formed over at least a portion of the third dielectric layer and a fourth dielectric layer formed over at least a portion of the third metallic layer.

18. The coated article of claim 14, wherein the primer layers comprise titanium, silicon, silicon dioxide, silicon nitride, silicon oxynitride, nickel-chrome alloys, zirconium, aluminum, alloys of silicon and aluminum, alloys containing cobalt and chromium, or mixtures thereof.

19. The coated article of claim 14, wherein the dielectric layers comprise at least two different metal oxide films in direct contact with each other.

* * * * *